(12) United States Patent
Roy

(10) Patent No.: US 8,669,510 B2
(45) Date of Patent: Mar. 11, 2014

(54) IMAGING DEVICE IN PARTICULAR OF THE CMOS TIME DELAY AND INTEGRATION TYPE

(75) Inventor: François Roy, Seyssins (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 258 days.

(21) Appl. No.: 13/240,483

(22) Filed: Sep. 22, 2011

(65) Prior Publication Data

US 2012/0097838 A1  Apr. 26, 2012

(30) Foreign Application Priority Data

Oct. 22, 2010 (FR) .................................... 10 58646

(51) Int. Cl.
*H01L 31/062* (2012.01)

(52) U.S. Cl.
USPC ................. 250/208.1; 257/232; 257/E27.132

(58) Field of Classification Search
USPC ........ 250/208.1; 257/232, E27.231, E27.133; 348/295
See application file for complete search history.

(56) References Cited

U.S. PATENT DOCUMENTS

| | | | |
|---|---|---|---|
| 5,469,239 A | 11/1995 | Ishida et al. ................... 354/402 |
| 5,539,461 A * | 7/1996 | Andoh et al. ................. 348/308 |
| 6,906,746 B2 | 6/2005 | Hijishiri et al. ............ 348/240.2 |
| 7,212,240 B1 | 5/2007 | Litwiller ........................ 348/294 |
| 2008/0217661 A1 | 9/2008 | Lauxtermann ................ 257/233 |

* cited by examiner

*Primary Examiner* — Tony Ko
(74) *Attorney, Agent, or Firm* — Allen, Dyer, Doppelt, Milbrath & Gilchrist, P.A.

(57) ABSTRACT

An imaging device may be formed in a semiconductor substrate including a matrix array of photosites extending in a first direction and a second direction. The imaging device may include a transfer module configured to transfer charge in the first direction and an extraction module configured to extract charge in the second direction.

21 Claims, 4 Drawing Sheets

IMAGING DEVICE IN PARTICULAR OF THE CMOS TIME DELAY AND INTEGRATION TYPE

FIELD OF THE INVENTION

The present disclosure relates to imaging devices comprising matrix arrays of pixels, and more particularly to image sensors, called time delay and integration (TDI) sensors, using complementary metal oxide semiconductor (CMOS) technology.

BACKGROUND OF THE INVENTION

An imaging device, or sensor, is a light-sensitive electronic component that converts electromagnetic radiation into an analog electrical signal. This signal is then amplified and digitized by an analog-to-digital converter and finally processed to obtain a digital image.

The imaging device uses the photoelectric effect, whereby incident photons tear electrons from each active element, called a photosite. An imaging device generally comprises photosites arranged in a matrix, each photosite corresponding to a pixel of an image. The photons, sensed by the semiconductor-component-based imaging device, are converted into electron/hole pairs in the silicon. More precisely, the charge created in the light-sensitive regions is stored in the photosite before being output using an electronic system.

There exists two major families of imaging devices or sensors: charge-transfer sensors, otherwise known as charge-coupled devices (CCDs) and CMOS sensors, or active pixel sensor (APS) CMOS sensors. CCD sensors are the easiest to fabricate. They have good sensitivity, but the charge transfer is relatively slow due to their operating principle.

CMOS sensors comprise an integrated circuit incorporating cells containing light-sensitive regions, such as photodiodes, amplification, and shutter logic. This is in contrast to CCD sensors, which do not possess internal amplification and shutter electronics. They are more complicated to fabricate, but are produced using typical microelectronics techniques and therefore can be of substantial size. These CMOS sensors are widely used as autofocus sensors for digital reflex cameras.

A CMOS sensor provides an approach to the size and speed problems of passive image sensors, such as CCD sensors. CMOS sensors consume less power relative to CCD sensors, and also cost less to produce. In addition, owing to their structure, they combine image sensor and image processing functions.

In numerous image-capture-related applications, the subject of an image is likely to be moving at a constant velocity relative to the camera, and more particularly, relative to the sensor (imaging device). For example, the image of a moving object may be captured by a stationary camera, or the image of a stationary object may be captured by a camera in a moving vehicle, for example.

Consequently, in the case of an object having a high relative velocity with respect to a sensor, the integration time available to a photosite is correspondingly shorter. This is because, if the integration time of the photosites is too long, the same photons received by one photosite may also be received by the neighboring photosite, which may have collected other photons just beforehand. The photons then cover several photosites instead of only one, and the image obtained may be blurred.

A technique called time delay and integration (TDI) is used in line-scan image sensors when only a small amount of light is received, implying a long exposure time, or when the subject of an image has a high velocity. This technique makes it possible to integrate, over a longer time than the time available for integration in a single photosite, enough light when the subject of the image is moving relative to the sensor.

The TDI function has naturally been applied to CCD imaging devices, or sensors, by transferring a charge packet along the sensor synchronously with the movement of the image. This is because the intrinsic operation of a CCD sensor uses charge transfer. The transfer of the charge packet intrinsic to the operation of the CCD is synchronized with the relative movement of the subject of the image relative to the sensor so that the integration is carried out on the following photosite for the same light ray.

CMOS imaging devices do not use charge transfer from one photosite to another, as is the case for CCD sensors. The TDI function using charge summing cannot be carried out in typical CMOS sensors. U.S. Pat. No. 6,906,746 to Hijishiri et al. discloses the application of a TDI technique to a typical CMOS sensor. However, charge transfer being difficult in typical CMOS sensors, the TDI function does not result in an accumulation of charge, but in a summing of the voltages output by the photosites, corresponding to the charge respectively collected in each photosite. This voltage summing may lead to the summing of noise, interfering with the voltage measurements and degrading the image obtained.

SUMMARY OF THE INVENTION

According to one embodiment, a CMOS sensor is provided that may transfer charge between two photosites, implement a TDI function summing charge in one direction, and extract the summed charge in a transverse direction.

According to one aspect, an imaging device is formed in a semiconductor substrate comprising a matrix array of photosites extending in a first direction and a second direction. The imaging device may comprise transfer means or a transfer module configured to transfer charge in the first direction and extraction means or an extraction module configured to extract charge in the second direction.

The imaging device may possess both the intrinsic features of a CCD sensor relative to charge transfer and of a CMOS image sensor relative to charge extraction in a direction transverse to the charge transfer direction. The imaging device is therefore able to transfer charge longitudinally and to extract charge laterally. The device may form a CMOS TDI imaging device.

Preferably, the transfer module comprises, for each photosite, elementary means or an elementary module for transferring charge in the first direction, and the extraction module comprises, for each photosite, elementary means or an elementary module for extracting charge in the second direction. These elementary charge transfer modules allow each photosite to transfer the charge collected to the following photosite.

The elementary module for transferring charge may advantageously comprise at least two electrode/counter-electrode pairs, an electrode/counter-electrode pair comprising an electrode and a counter electrode facing each other and extending in the first direction. The at least two electrode/counter-electrode pairs may be placed in succession in the first direction, and the transfer module may further comprise means or a controller configured to apply potential differences to two successive electrode/counter-electrode pairs.

The transfer of charge from electrode/counter-electrode pair to electrode/counter-electrode pair, and therefore from photosite to photosite, may be then ensured by successive modifications of the potentials applied to the electrodes. The charge accumulated in the potential wells is transferred in the first direction, by modifying the potentials so as to modify the potential wells and the potential barriers.

In some embodiments, the elementary module for extracting charge may comprise connection means or a connector able to connect the electrode of a first electrode/counter-electrode pair of the photosite to the electrode of a second electrode/counter-electrode pair of the photosite. The first and the second electrode/counter-electrode pair may be adjacent in the photosite, and the extraction means or an extraction module may further comprise means or a controller configured to apply different potentials, on the one hand, to the two connected electrodes, and, on the other hand, to the two adjacent corresponding counter electrodes.

By connecting in this way the two electrodes of two successive electrode/counter-electrode pairs, and by keeping the two counter electrodes of the two electrode/counter-electrode pairs unconnected, it is possible to transfer charge in the first direction or extract charge, in the second direction, from the two electrode/counter-electrode pairs. This is because, when a high electrical potential is applied to the electrodes, modification of the electrical potentials on the associated counter electrodes may allow charge to be transferred in the first direction. However, when a low potential is applied to the electrodes, applying a high potential to the two counter electrodes causes charge to be extracted in the second direction.

Advantageously, the imaging device may comprise control means or a controller able to activate the transfer modules in groups of at least one photosite extending in succession in the first direction and able to activate the extraction modules in the photosite or photosites of the last group. The controller may be connected to the electrodes so as to control the potentials applied in succession and to control the transfer and extraction of charge. The controller may comprise a transfer transistor permitting the transfer of charge stored in the photosite towards a charge collection region.

The imaging device may also comprise means or a controller for transforming the charge extracted by the extraction modules into a corresponding voltage. The transformation means or the transformation module may transform the charge collected in the charge collection region into a signal the voltage of which depends on the charge accumulated in the photosite. This charge collection region forms a sensing node to which typical control electronics are connected, especially comprising a read transistor. The imaging device may form a CMOS TDI imaging device.

According to another aspect, a method is provided for operating a matrix array of semiconductor photosites organized in a first direction and a second direction. According to a general feature, the method may comprise charge transfer in the first direction and charge extraction in the second direction. Advantageously, each photosite may comprise at least two electrode/counter-electrode pairs that are adjacent in the first direction, each pair comprising an electrode and a counter electrode facing each other and extending in the first direction. The charge transfer in the first direction may comprise applying electrical potential differences between the at least two adjacent electrode/counter-electrode pairs.

The charge extraction from a photosite in the second direction may comprise applying an electrical potential having a first level, corresponding to a low (denoted 0) level, to the electrode of a first electrode/counter-electrode pair of the photosite and to the electrode of a second electrode/counter-electrode pair of the photosite, and applying a potential having a second level, corresponding to a high (denoted 1) level, to the counter electrodes of the first and second electrode/counter-electrode pairs. The method may comprise activating the charge transfer in groups of at least one photosite extending in succession in the first direction and activating the charge extraction in the photosite or photosites of the last group. The method may also comprise transforming the charge extracted from a photosite into a corresponding voltage.

BRIEF DESCRIPTION OF THE DRAWINGS

Other advantages and features of the present disclosure may become clear on examining the detailed description of non-limiting methods of implementation and embodiments, and the appended drawings in which.

DETAILED DESCRIPTION OF THE PREFERRED EMBODIMENTS

Figure 1:
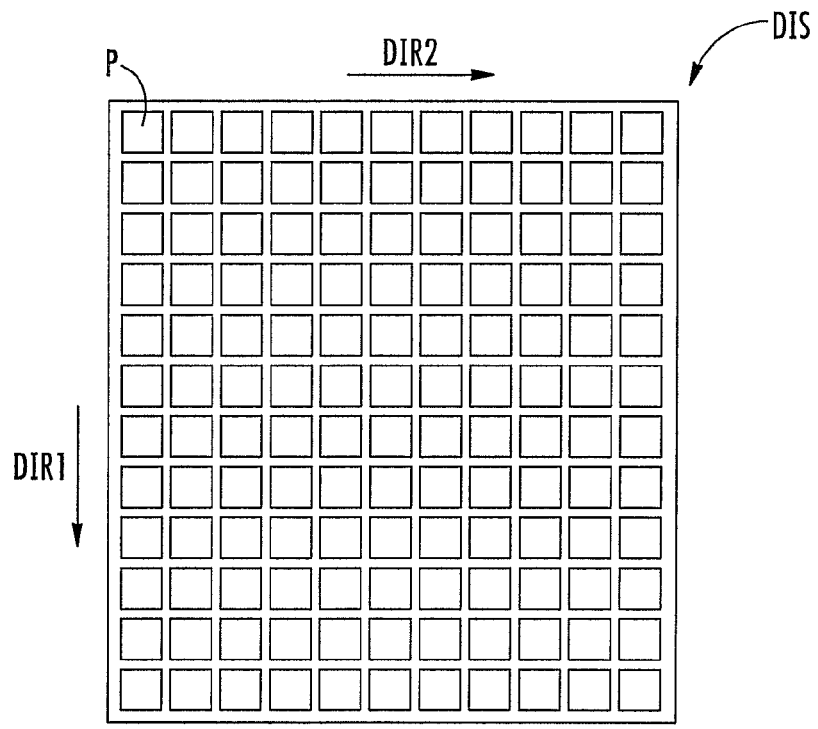
FIG. 1 shows a matrix array of photosites of an imaging device, according to the present disclosure.

FIG. 1 shows a CMOS imaging device or sensor DIS comprising a matrix array of photosites P extending in a first direction DIR1, for example, columns, and in a second direction DIR2, for example, lines or rows. Each photosite P corresponds to a pixel of an image. Thus, the signals delivered by each photosite P combined with their coordinates in the matrix allow an image to be formed. A photosite P of the matrix array of the sensor comprises a semiconductor photodiode, allowing photons received to be transformed into electron/hole pairs, and internal amplification electronics associated with the photodiode of the photosite P.

Figure 2:
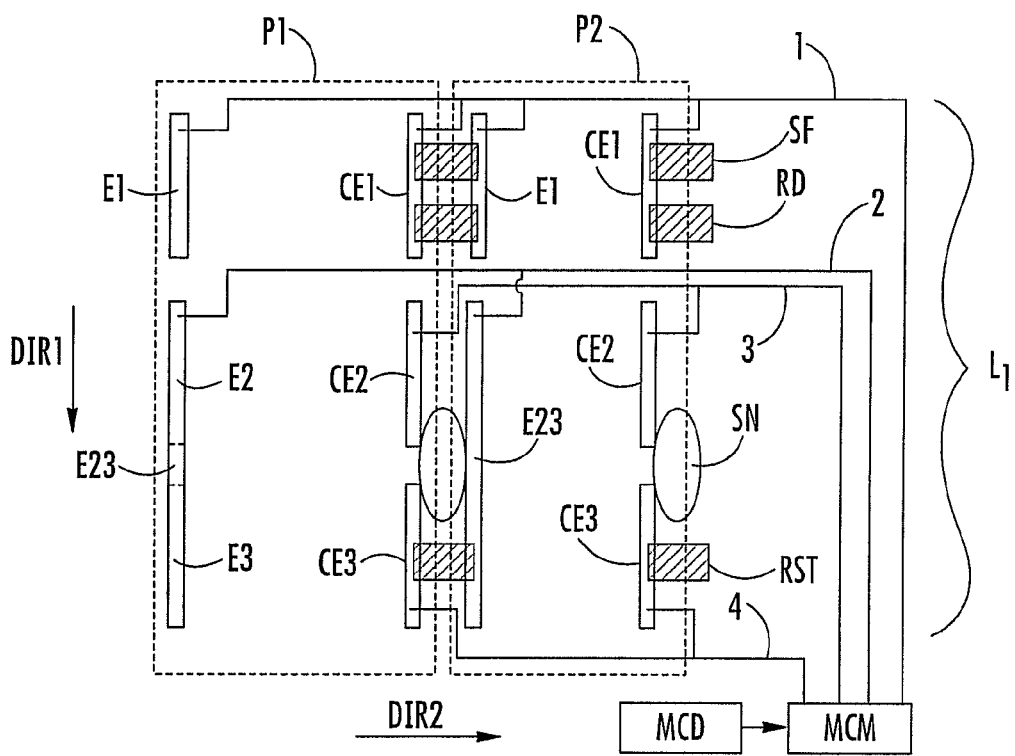
FIG. 2 shows a photosite, according to the present disclosure.

FIG. 2 schematically shows a top view of two adjacent photosites P1 and P2 in a given row Li of the matrix array according to one embodiment of the present disclosure. In this embodiment, each photosite P comprises three electrode/counter-electrode pairs. A photosite P may comprise at least two electrode/counter-electrode pairs for longitudinal transfer in the first direction DIR1.

An electrode/counter-electrode pair comprises an electrode E and a counter electrode CE. The electrode E and the counter electrode CE of the same pair are placed opposite each other and extend in the first direction DIR1, corresponding to the direction of the columns of the matrix array of the imaging device. The electrodes E of the various pairs of a photosite are placed on a given side, and the counter electrodes CE are placed on the opposite side.

Of course, an electrode may be considered as a counter electrode and vice versa. In this embodiment, the first electrode/counter-electrode pair of a photosite comprises an electrode E1 and a counter electrode CE1 electrically connected together by a first connection element 1. Thus, the electrical potential applied to the electrode E1 of the first pair may be the same as the potential applied to the counter electrode CE1 of the same pair, and the same as that applied to the analogous electrodes Ex and counter electrodes CEx of the other photosites of the same row Li.

The second electrode/counter-electrode pair of a photosite P comprises an electrode E2 connected to the electrode E3 of the third electrode/counter-electrode pair while the counter electrode CE2 of the second electrode/counter-electrode pair and the counter electrode CE3 of the third electrode/counter-electrode pair are electrically independent. The counter electrode CE2 of the second pair is electrically independent of the associated electrode E2, and the counter electrode CE3 of the third pair is electrically independent of its associated electrode E3. The electrodes E2 and E3 of the second and third pairs, which are mutually connected together, are independent of any other electrode Ex of the photosite, i.e. the electrode E1 of the first pair in the example shown.

In the exemplary embodiment illustrated in FIG. 2, the electrode E2 of the second pair is connected to the electrode E3 of the third pair by replacing the electrodes E2 and E3 of the second and third pairs by a single larger common electrode E23. In FIG. 2, the electrodes E2 and E3 have been fictitiously shown in the photosite P1 by dashed lines on the electrode E23 common to the second and third pairs. In another embodiment, these two electrodes, E2 and E3, could be connected using an electrical connection between the two electrodes E2 and E3. Electrical connection of the two electrodes E2 and E3 of the second and third pairs, on the one hand, and the electrical independence of the associated counter electrodes CE2 and CE3, on the other, allow charge to be extracted from the side of the electrically independent counter electrodes CE2 and CE3.

Each photosite of the matrix array has an identical structure. As illustrated in FIG. 2, the electrodes and counter electrodes of the first, second, and third pairs of the photosites of a given row are respectively connected together. The common electrodes E23 of each photosite P1 and P2 of a given row Li are connected together by a second connection element 2. Similarly, the second counter electrodes CE2 of each photosite P1 and P2 of a given row Li are connected together by a third connection element 3, and the third counter electrodes CE3 of each photosite P1 and P2 of a given row Li are connected together by a fourth connection element 4. In this way, the second and third pairs of the photosites of a given row are controlled together.

A first controller (means) MCM having a typical structure may allow, with the connection elements 1 to 4, appropriate potentials to be applied to the electrodes and counter electrodes so as to allow charge to be transferred and extracted, as will be explained in greater detail below. The first controller MCM is controlled by control means or a second controller MCD setting the first controller MCM according to rules for configuring the potential differences to be applied to the electrode/counter-electrode pairs.

The electrode/counter electrode pairs form part of the means for transferring (transfer module) charge in the first direction DIR1, corresponding to the direction parallel to the columns of the matrix array. In the following, this first direction DIR1 may be referred to as the longitudinal direction.

Moreover, the second and third pairs of a photosite also form part of charge extraction means (extraction module) allowing the charge accumulated in a photosite to be extracted in a second direction DIR2 corresponding to the direction parallel to the rows of the matrix array. In the following, this second direction DIR2 may be referred to as the lateral direction.

How the charge transfer and the charge extraction operate may be explained below. Each photosite P also comprises means or components for transforming the charge extracted by the extraction module into a corresponding voltage. The charge stored in the photosite is extracted towards a charge collection region located between the counter electrodes of the second and third pairs. This charge collection region forms a sensing node SN to which control electronics are connected forming the transformation means or a transformer comprising a read transistor RD allowing the charge collected to be read, i.e. measured. A source follower transistor SF may make it possible to transfer the signal of the sensing node onto the column by the line-selection transistor RD for amplifying the signal, and a reset transistor RST may make it possible to reset the sensing node before the measurement is carried out.

This is because, in a CMOS-technology imaging device, a photosite P is an active sensor that operates cyclically, a cycle comprising at least one charge accumulation step, a measurement step, and a reset step. The accumulation step corresponds to the photo-generation of charge and its accumulation, during exposure of the photodiode. The measurement step corresponds to the generation of a signal the voltage of which depends on the amount of photo-generated charge accumulated in the photodiode. The reset step corresponds to the removal of the photo-generated charge before a new measurement step.

In the present case, when charge is extracted in the lateral direction DIR2 after the charge accumulation step, the operation of the photosite P comprises a reset step allowing the measurement to be reset, then a first measurement step followed by a step of measurement transfer to the source follower SF, and finally a second measurement step. Two measurement steps are carried out in order to subtract the noise due to the reset transistor RST. The reset noise is obtained from the subtraction of the two measurements. In this way, the delivered signal is free from reset noise.

Figure 3:
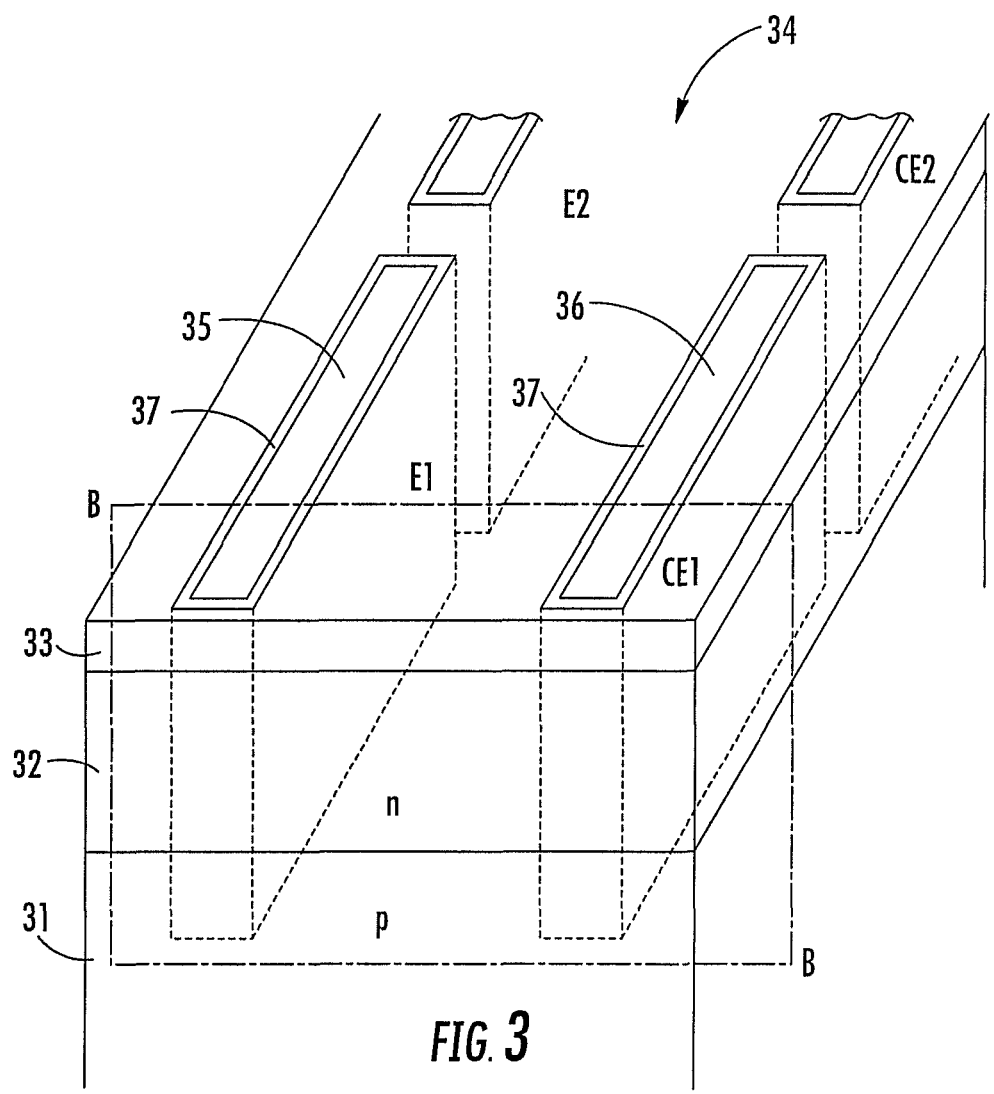
FIGS. 3 and 4 respectively illustrate a perspective view and a cross-sectional view, along the plane B-B, of a sensor portion, according to the present disclosure.
Figure 4:
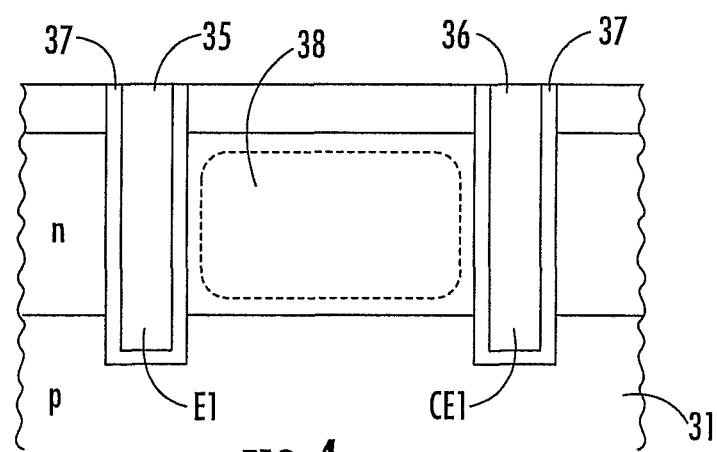

FIGS. 3 and 4 respectively illustrate a perspective view and a cross-sectional view of exemplary electrode/counter-electrode pairs (E1, CE1) and (E2, CE2) of a photosite P within a semiconductor image sensor. An n-type doped layer 32 is placed on a p-type doped silicon substrate 31. The layer 32 and optionally the upper part of the substrate 31 form a photo-conversion region of the sensor. A thin, p-type doped layer 33 is formed on the surface of the layer 32. The layer 33 prevents an interface forming between the top side of the layer 32 and a top layer (not shown) of silicon oxide. This is because the presence of an interface between the layer 32 containing charge carriers and a layer of silicon oxide leads to a reduction in the number of carriers, through trapping at the interface, or to an increase in the dark current. The layer 33 also maintains a reference voltage in the layer 32.

The top part of the photo-conversion region is divided into a plurality of aisles 34 bounded by rows of isolated electrodes 35 and isolated counter electrodes 36 extending vertically through the layers 33, 32 and 31. Each row of electrodes 35 and each row of counter electrodes 36 form, for example, successive, aligned, parallel piped-shaped cavities or grooves filled with doped polycrystalline silicon isolated from the substrate by an oxide layer 37. The electrodes 35 and the counter electrodes 36 bounding an aisle 34 are placed facing each other and respectively form columns of electrodes and counter electrodes.

The electrodes 35 (E1, E2, etc.) and counter electrodes 36 (CE1, CE2, etc.), suitably biased, define in each aisle 34 a succession of potential wells in which electric charge can accumulate. In this example, only the first pair, comprising the electrode E1 and the counter electrode CE1 of a photosite, has been shown, and part of the second pair, comprising the electrode E2 and the counter electrode CE2, may be seen in FIG. 3.

A potential well is created by applying a high potential, for example, about 5 V, to the electrode E1 and counter electrode CE1 of the first pair of a photosite, and a low potential, lower than the high potential, for example, about 0 V, to the electrode E2 and the counter electrode CE2 of the second pair of the photosite, and to the other pairs of the photosite if there are more than two. During an image acquisition period, the top side of the sensor is illuminated and electrons, generated by the creation of an electron/hole pair, by absorption of a photon in the photo-conversion region, accumulate in the potential wells, which fill proportionally to the illumination of the corresponding pixel. The substrate 31 is connected, in operation, to a reference potential, for example, to ground, allowing the holes generated by the photo-conversion to flow away. The depth of the electrodes 35 and the counter electrodes 36 is preferably chosen so as to limit crosstalk, i.e. this depth is preferably equal to the depth of the region in which most of the incident photons are likely to create electron/hole pairs (for example, 9 µm for red light).

The bias of the electrodes 35 and counter electrodes 36 is such that the photo-generated electrons accumulate in the n-type layer 32, in a volume 38 delimited schematically by the dashed lines in FIG. 4. It should be noted that there is no direct interface between the electron-accumulation volume 38 and the oxide layer 37 for isolating the electrodes 35 and counter electrodes 36, or with a top oxide layer, thereby preventing charge losses at the interface.

In order to maximize the charge storage capacity between the electrodes, the thickness of the layer 32 is preferably similar to the depth of the electrodes 35 and counter electrodes 36. Thus, the photo-conversion region is essentially formed by the n-type layer 32.

Figure 5:
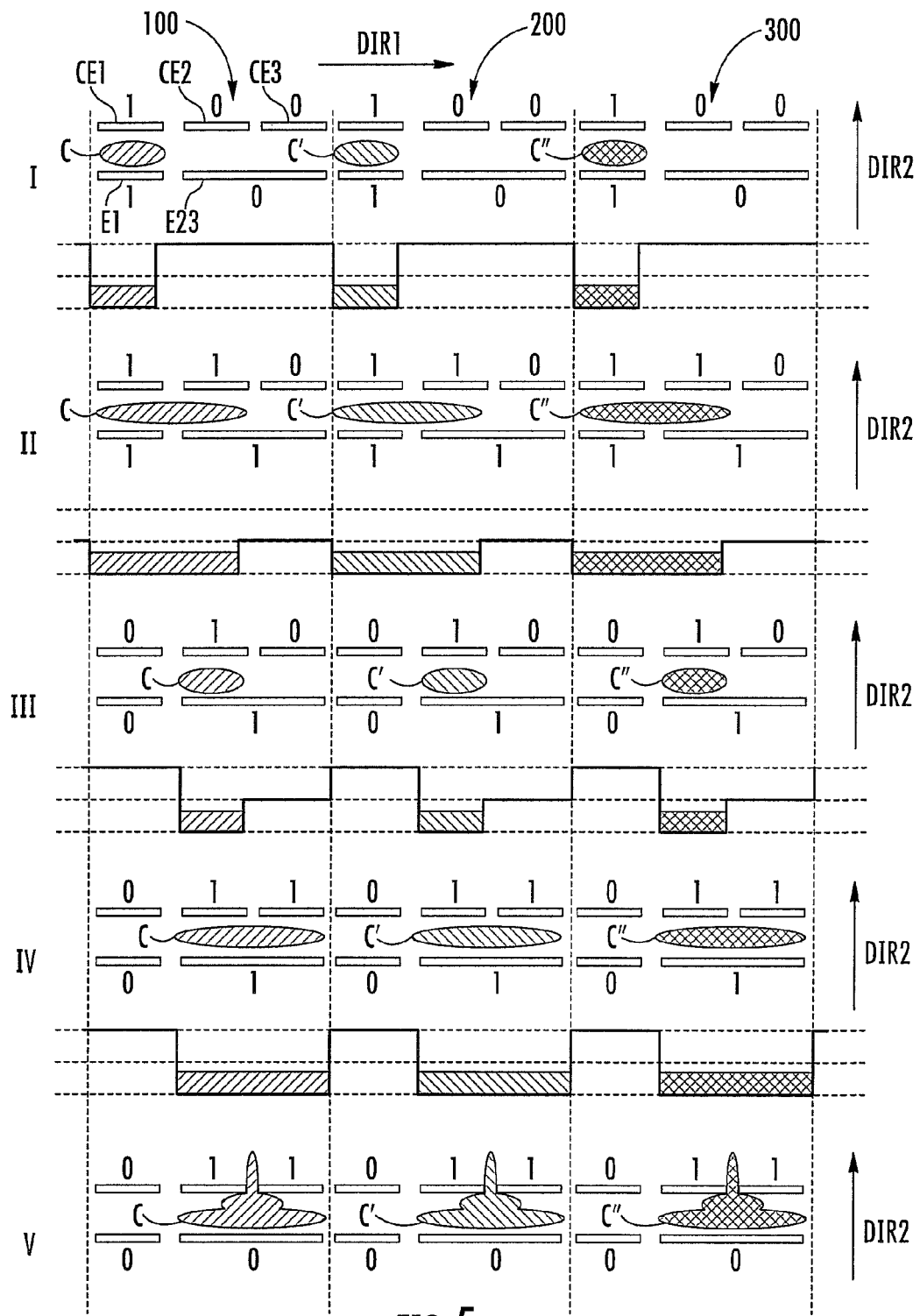
FIG. 5 is a schematic diagram of a transfer of a charge packet accumulated in a group of photosites, according to the present disclosure.

FIG. 5 shows the transfer of a charge packet accumulated in a group of photosites P after a period of image acquisition. Once the charge has been accumulated in the photosites P, this charge may be either transferred longitudinally in the first direction DIR1, i.e. from photosite to photosite in a given column, or extracted laterally from the photosite P in the second direction DIR2.

FIG. 5 shows five operating steps in relation to a group of three photosites 100, 200 and 300 in a given row. In the figure, for the ease of readability, the electrode/counter-electrode pairs have been positioned horizontally whereas they are placed vertically in the imaging device in FIG. 2 especially. Moreover, the charge and the electrical potential associated with the electrodes have been shown schematically beneath each electrode/counter-electrode pair, except for step V for which the reader is referred to FIG. 7.

In a first step I, charge C, C' and C" accumulate in each photosite 100, 200 and 300 in the potential well created between the electrode E1 and the counter electrode CE1 of the first pair of each photosite P. This potential well is created by applying a high (denoted 1) potential to the electrode E1 and counter electrode CE1 of the first pair and by applying a low (denoted zero) potential to the counter electrodes CE2 and CE3 of the second pair and third pair and to the electrode E23 common to the second and third pairs.

In a second step II, the charge is transferred toward the second pair of the photosite P in which it is located. To do this, the electrode E1 and the counter electrode CE1 of the first pair are kept at a high potential and a high potential is also applied to the counter electrode CE2 of the second pair and to the electrode E23 common to the second and third pairs while the counter electrode CE3 of the third pair is kept at a low potential.

Figure 6:
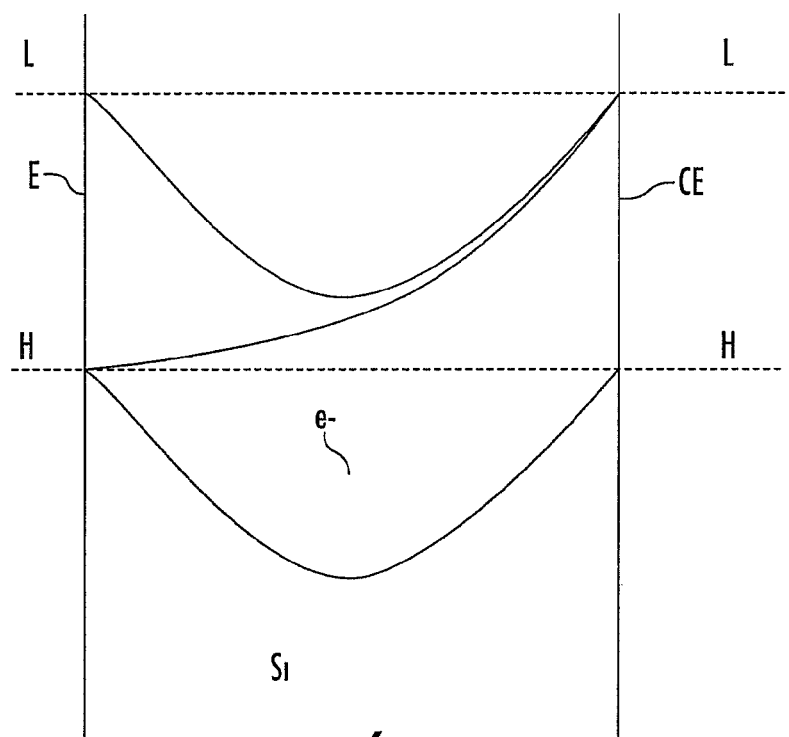
FIG. 6 is a schematic diagram of the potential wells and the potential barrier created with a first potential configuration applied to an electrode and a counter electrode of the same pair, according to the present disclosure.

FIG. 6 illustrates the potential wells and barrier created with a first potential configuration applied to one electrode E and one counter electrode CE of a given electrode/counter-electrode pair. According to convention, the potentials are shown as decreasing potentials. Thus, as may be seen in the figure, when a high potential H, corresponding to a logic level of 1, is applied to the electrode E and to the counter electrode CE of the same pair, a potential well is created. This potential well allows charge e⁻ to be collected and accumulated. However, when a low potential L, corresponding to a logic level of 0, is applied to the electrode E and to the counter electrode CE of a given pair, no charge can be collected because no well is formed. In addition, when the electrode E is at a high potential H and the counter electrode CE is at a low potential L, charge cannot migrate from the preceding pair towards this pair, and can therefore not be collected by this pair.

In a third step III (FIG. 5), the electrode E1 and the counter electrode CE1 of the first pair of photosites 100, 200 and 300 are passed to a low potential, while the counter electrode CE2 of the second pair and the electrode E23 common to the second and third pairs are kept at a high potential, and the counter electrode CE3 of the third pair is kept at a low potential. In this configuration, the charge is contained in the potential well created between the counter electrode CE2 of the second pair and the electrode E23 common to the second and third pairs.

In a fourth step IV, the charge continues to be transferred longitudinally, within the same photosite P for the moment. The electrode E1 and the counter electrode CE1 of the first pair are kept at a low potential, while the counter electrode CE3 of the third pair is passed to a high potential so that the counter electrodes of the second and third pairs CE2 and CE3 and the electrode E23 common to these two pairs are all at a high potential. The charge is therefore spread over the potential well created between the counter electrodes CE2 and CE3 and the electrode E23 of the two pairs.

At this moment, there are two separate possible ways forward. A first possibility (not shown) includes transferring the charge packet longitudinally towards the following photosite P. This possibility is envisioned more particularly in the case where a "time delay and integration" technology, i.e. a TDI function, is applied so as to integrate the light received over a time corresponding to the longitudinal transfer between two or more photosites P. This is because, by transferring the charge packet to the following photosite P, and by applying corresponding electronics thereto, it is possible to carry out a second charge accumulation for the same scene and thus to sum it with the charge already accumulated for this same scene.

To carry out this longitudinal transfer of the accumulated charge towards the following photosite P, following the fourth step D, a low potential is applied, in a first step, to the counter electrode CE2 of the second pair so as to concentrate the charge in the potential well then created between the counter electrode CE3 of the third pair and the electrode E23 common to the second and third pairs, while the electrode E1 and the counter electrode CE1 of the first pair are kept at a low potential. Finally, in a following step, a high potential is applied to the electrode E1 and to the counter electrode CE1 of the first pair, while the second and the third pair are kept in the preceding configuration. Thus, a potential well is created between the third pair of a photosite P and the first pair of the following photosite P, so as to transfer the charge and spread it between these two pairs. The transfer of charge towards the following photosite P is finished by applying the configuration of the first step A, in which the charge is contained in the single potential well of the first pair.

The second possible way forward after the fourth step IV has finished is to extract the charge laterally. This extraction of the charge is then followed by a measurement of the charge and a transformation of the charge into a signal, the voltage of which is proportional to the amount of charge extracted. In a TDI application, it is assumed then that the charge accumulated, which may be extracted laterally, results from a transfer over several photosites located upstream in the column relative to the photosites shown in FIG. 5.

In order to extract the charge laterally, following the fourth step IV, a low potential is applied, in a step V, to the electrode E23 common to the second and third pairs, and a high potential is applied to the counter electrodes CE2 and CE3.

Figure 7:
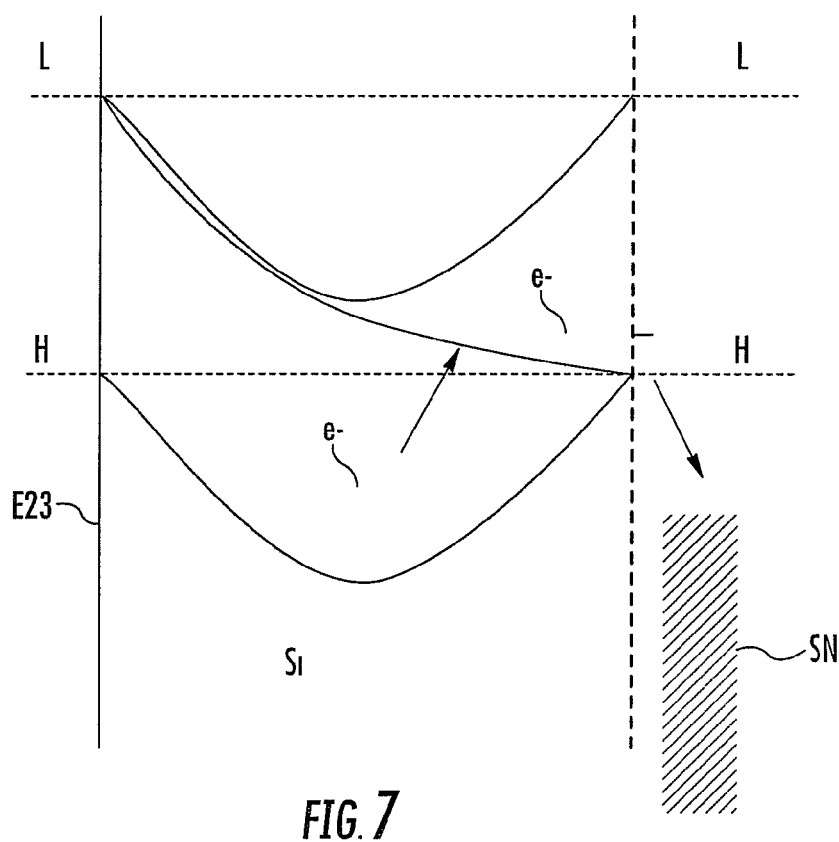
FIG. 7 is a schematic diagram of the potential wells and the potential barrier created with a second potential configuration applied to the second and third electrode/counter-electrode pairs, according to the present disclosure.

As illustrated in FIG. 7, applying a low potential L to the electrode E23 common to the second and third pairs while a high potential H is applied to the counter electrode CE2 of the second pair and to the counter electrode CE3 of the third pair causes a potential barrier to appear which tends to repulse the charge accumulated in the potential well formed beforehand, so that the charge is pushed into the space separating the counter electrodes CE2 and CE3 of the second and third pairs.

These charges thus extracted may then be collected by the sensing node SN so as to be transformed into a voltage. A CMOS imaging device according to such an embodiment thus allows a longitudinal charge transfer to be carried out and thus a TDI function comprising a summation of the accumulated charges to be produced while preserving the lateral charge extraction specific to CMOS image sensors.

That which is claimed is:

1. An imaging device comprising:
a semiconductor layer comprising a matrix array of photosites extending in first and second directions;
each photosite comprising
a plurality of electrode/counter-electrode pairs arranged in series and wherein a length of the plurality of electrode/counter-electrode pairs extends in the first direction, said plurality of electrode/counter-electrode pairs configured to transfer charge in the first direction and to extract charge in the second direction.

2. The imaging device according to claim 1 wherein said matrix array of photosites extends in the first direction comprising a column direction and the second direction comprising a row direction.

3. The imaging device according to claim 1 wherein each electrode/counter-electrode pair comprises an electrode and a counter electrode facing each other and extending in the first direction; and further comprising a first controller configured to apply potential differences to successive electrode/counter-electrode pairs.

4. The imaging device according to claim 1 wherein each photosite comprises a connector configured to connect the electrode of a first electrode/counter-electrode pair to the electrode of a second electrode/counter-electrode pair; wherein the first and the second electrode/counter-electrode pairs are adjacent in the photosite; and wherein said first controller is configured to alternatively apply different potentials to the two connected electrodes and to the two adjacent corresponding counter electrodes.

5. The imaging device according to claim 1 further comprising a second controller configured to activate charge transfer for groups of photosites extending in series in the first direction and to activate charge extraction. in at least one photosite of a last group of the groups of photosites.

6. The imaging device according to claim 1 further comprising a transformer configured to change a charge extracted into a corresponding voltage.

7. The imaging device according to claim 1 wherein said semiconductor layer forms a CMOS time delay and integration imaging device.

8. An electronic device comprising;
a controller;
an imaging device coupled to said controller and comprising
a semiconductor layer comprising a matrix array of photosites extending in first and second directions, each photosite comprising
a plurality of electrode/counter-electrode pairs arranged in series and wherein a length of the plurality of electrode/counter-electrode pairs extends in the first direction, said plurality of electrode/counter-electrode pairs configured to transfer charge in the first direction and to extract charge in the second direction.

9. The electronic device according to claim 8 wherein said matrix array of photosites extends in the first direction comprising a column direction and the second direction comprising a row direction.

10. The electronic device according to claim 8 wherein each electrode/counter-electrode pair comprises an electrode and a counter electrode facing each other and extending in the first direction; and further comprising a first controller configured to apply potential differences to successive electrode/counter-electrode pairs.

11. The electronic device according to claim 10 wherein said each photosite comprises a connector configured to connect the electrode of a first electrode/counter-electrode pair to the electrode of a second electrode/counter-electrode pair ; wherein the first and the second electrode/counter-electrode pairs are adjacent in the photosite; and wherein said first controller is configured to alternatively apply different potentials to the two connected electrodes and to the two adjacent corresponding counter electrodes.

12. A method for operating a matrix array of photosites arranged in a first direction and a second direction, each photosite comprising a plurality of electrode/counter-electrode pairs arranged in series and wherein a length of the plurality of electrode/counter-electrode pairs extends in the first direction, the method comprising:
transferring charge from photosites in the first direction using the plurality of electrode/counter-electrode pairs; and
extracting charge from the photosites in the second direction using the plurality of electrode/counter-electrode pairs.

13. The method according to claim 12 wherein the matrix array of photosites extends in the first direction comprising a column direction and the second direction comprising a row direction.

14. The method according to claim. 12 wherein the plurality of electrode/counter-electrode pairs is positioned adjacent in the first direction, each of electrode/counter-electrode pair comprising an electrode and a counter electrode facing each other and extending in the first direction; and wherein transferring charge in the first direction comprises applying electrical potential differences between adjacent electrode/counter-electrode pairs.

15. The method according to claim 14 wherein extracting charge from a photosite in the second direction comprises applying an electrical potential having a first level to the electrode of a first electrode/counter-electrode pair of the photosite and to the electrode of a second electrode/counter-electrode pair of the photosite, and applying a potential having a second level to the counter electrodes of the first and second electrode/counter-electrode pairs.

16. The method according to claim 12 further comprising activating the charge transfer in groups extending in series in the first direction, and activating the charge extraction in at least one photosite of the last group.

17. The method according to claim 12 further comprising transforming the charge extracted from a photosite into a corresponding voltage.

18. A method for making an imaging device comprising:
forming a semiconductor layer comprising a matrix array of photosites extending in first and second directions, each photosite comprising
a plurality of electrode/counter-electrode pairs arranged in series and wherein a length of the plurality of electrode/counter-electrode pairs extends in the first direction, the plurality of electrode/counter-electrode pairs being for transferring charge in the first direction extracting charge in the second direction.

19. The method according to claim 18 further comprising forming the matrix array of photosites to extend in the first direction comprising a column direction and the second direction comprising a row direction.

20. The method according to claim 19 wherein each electrode/counter-electrode pair comprising an electrode and a counter electrode facing each other and extending in the first direction; and further comprising using a first controller to apply potential differences to successive electrode/counter-electrode pairs.

21. The method according to claim 20 wherein each photosite comprises a connector to connect the electrode of a first electrode/counter-electrode pair to the electrode of a second electrode/counter-electrode pair ; wherein the first and the second electrode/counter-electrode pairs are adjacent in the photosite; and wherein the first controller alternatively applies different potentials to the two connected electrodes and to the two adjacent corresponding counter electrodes.

* * * * *

UNITED STATES PATENT AND TRADEMARK OFFICE
CERTIFICATE OF CORRECTION

PATENT NO.         : 8,669,510 B2
APPLICATION NO.    : 13/240483
DATED              : March 11, 2014
INVENTOR(S)        : Roy Page 1 of 1

It is certified that error appears in the above-identified patent and that said Letters Patent is hereby corrected as shown below:

In the Claims

Column 9, Line 54    Delete: "claim 1"
                     Insert: -- claim 3 --

Signed and Sealed this
Fifth Day of May, 2015

Michelle K. Lee
*Director of the United States Patent and Trademark Office*